United States Patent [19]
O'Connor et al.

[11] 3,933,572
[45] Jan. 20, 1976

[54] METHOD FOR GROWING CRYSTALS

[75] Inventors: Joseph R. O'Connor, Waquoit, Mass.; Leonard J. Small, Sunnyvale, Calif.

[73] Assignee: The United States of America as represented by the Secretary of the Air Force, Washington, D.C.

[22] Filed: Dec. 11, 1973

[21] Appl. No.: 423,857

[52] U.S. Cl............ 156/608; 23/301 SP; 23/273 SP; 423/508; 423/511
[51] Int. Cl.²........................................ B01J 17/10
[58] Field of Search.................. 23/310 SP, 273 SP; 148/1.6; 423/508, 511; 156/608

[56] References Cited
UNITED STATES PATENTS

| | | | |
|---|---|---|---|
| 2,855,335 | 10/1958 | Seiler et al. | 23/301 SP |
| 3,008,797 | 11/1961 | Bither et al. | 423/508 |
| 3,154,384 | 10/1964 | Jones | 148/1.6 X |
| 3,238,024 | 3/1966 | Cremer | 23/301 SP |
| 3,663,180 | 5/1972 | Brissot | 23/301 SP |

Primary Examiner—James H. Tayman, Jr.
Attorney, Agent, or Firm—Joseph E. Rusz; Cedric H. Kuhn

[57] ABSTRACT

A method of crystal growth is provided that comprises the steps of positioning a foraminous susceptor above and adjacent to a seed crystal and below and in contact with a column of crystal feed material; inductively heating the susceptor so as to melt the top of the seed crystal and a layer of the column adjacent the susceptor; passing crystal feed material melt through openings in the susceptor into contact with the seed crystal, thereby commencing crystal growth; lowering the column toward the heated susceptor, thereby melting the end of the column; and passing the resulting melt through openings in the susceptor to provide material for continued crystal growth.

7 Claims, 4 Drawing Figures

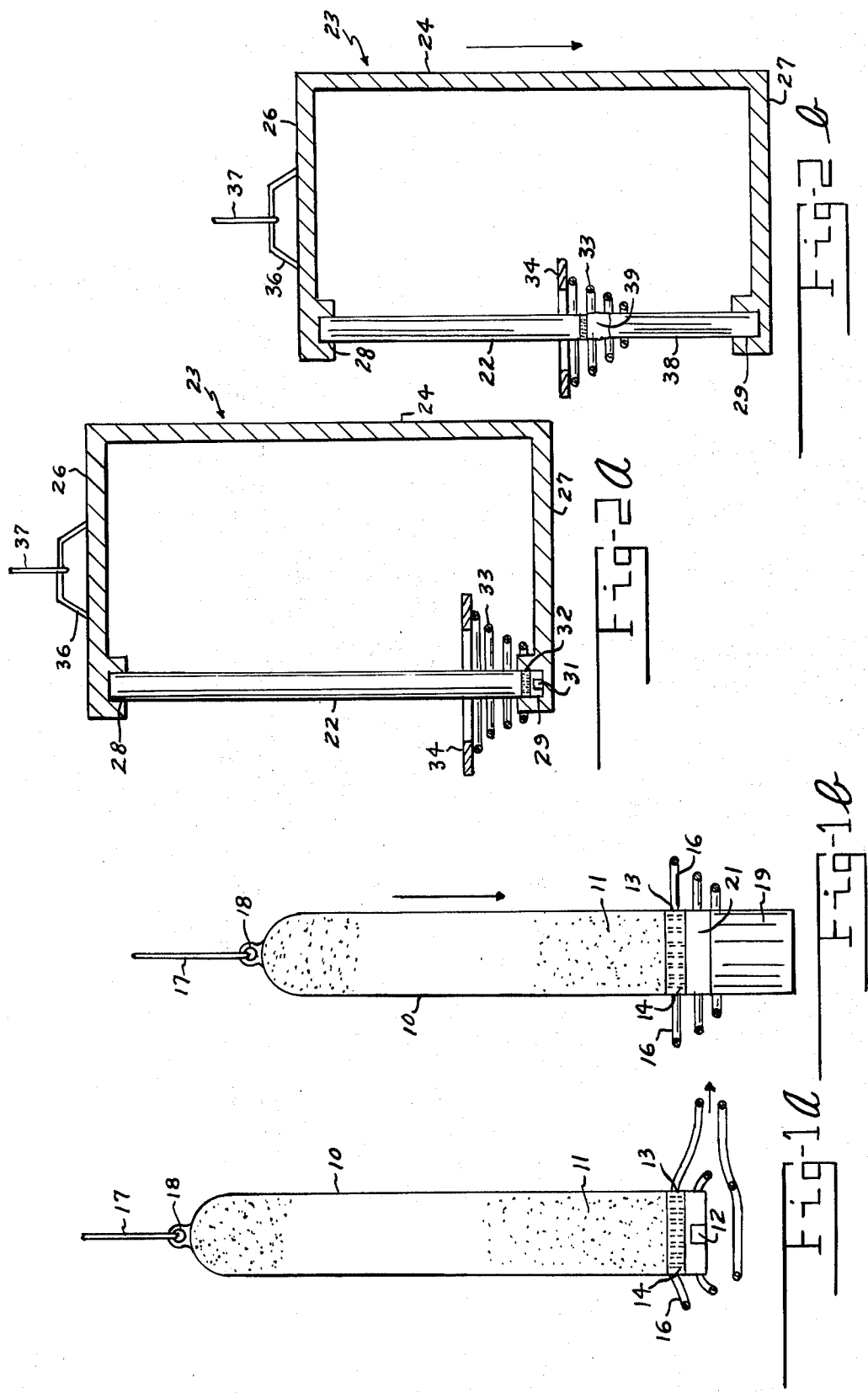

METHOD FOR GROWING CRYSTALS

FIELD OF THE INVENTION

This invention relates to a method of growing single crystals and to apparatus for conducting the method.

BACKGROUND OF THE INVENTION

All materials that depend on homogeneous nucleation for crystal growth supercool. Thus, the material can be slowly raised to its melting point (Te) and then the temperature of the melt can be lowered to a value Ts before freezing takes place. A measure of the supercooling is $\Delta T = (Te - Ts)/Te$. This value ranges form 0.1 to 0.3 for many elements and compounds while the value increases for alloys and heavily doped simiconductors. As the value increases it becomes more and more difficult to grow homogeneous, highly perfect, single crystals. Regardless of the method of crystal growing, theory shows that the growth rate ($f$) should be slow and the temperature gradient ($g$) across the solid-liquid interface should be as large as possible so that the ratio $g/f$ (°C sec/cm$^2$) is a large number. When the degree of supercooling increases ($\Delta T > 0.5$), analysis shows that $g/f$ must be greater than $5 \times 10^6$ °C sec/cm$^2$. This means that for a slow growth rate of 1 inch per day, the thermal gradient must exceed 140°C cm$^{-1}$.

There exists a large class of ternary compounds having unusual semiconducting and optical properties that have not been investigated in any detail. These compounds can be represented by the formulas $M_3AB_3$, $M_4A_2B_5$ and $MAB_2$, wherein A is P, As or Sb; B is S, Se or Te; and M is Na, K, Li, Ba, Ca, Mg, Be, Zr, Mn, Zn, Ce, Fe, Co, Ni, Cd, Pb, Sn, Cu, Ag, Au or Pt. Many of these compounds are natural minerals such as wolfsbergite (CuSbS$_2$), and the like. Of particular interest are proustite (Ag$_3$AsS$_3$), pyragyrite (Ag$_3$SbS$_3$) and smithite (AgAsS$_2$). These latter compounds are uniaxial (3m), have large birefringence (~0.2) and are transparent in the near infrared (1–15$\mu$) where high power gas lasers are available. These compounds have large non-linear coefficients and they have made efficient phase-matched harmonic generators and parametric oscillators. However, crystals are very difficult to grow from these materials because they exhibit large supercooling. For example, proustite melts at 480°C and can undercool by 150°C. This yields a $\Delta T$ of about 0.7 which means that $g/f$ must exceed about $5 \times 10^5$°C sec/cm$^2$.

It is an object of this invention, therefore, to provide a method of crystal growth that is particularly applicable to precursor compounds which exhibit large supercooling.

Another object of the invention is to provide apparatus for use in conducting the method of crystal growth.

Other objects and advantages of the invention will become apparent to those skilled in the art upon consideration of the accompanying disclosure and the drawing, in which:

FIGS. 1a and 1b show two positions of a schematic representation of one embodiment of the apparatus of this invention; and FIGS. 2a and 2b show two positions of a schematic representation of another embodiment of the apparatus of this invention.

SUMMARY OF THE INVENTION

The present invention resides in the discovery of a floating susceptor technique for growing crystals that presents a viable solution to the preparation of single crystals from materials which tend to undercool. According to the method of this invention a foraminous or perforate susceptor is disposed above and adjacent to a seed crystal and below and in contact with a column of crystal feed material. The susceptor is inductively heated so as to melt the top of the seed crystal and a layer of the column of material adjacent the susceptor. Melted crystal feed material flows through openings in the susceptor into contact with the seed material, thereby commencing crystal growth. The column of crystal feed material is continuously lowered toward the heated susceptor, thereby melting the end of the column. The resulting melt flows through openings in the susceptor to provide material for continued crystal growth.

Reference is now made to the drawing which depicts schematically one embodiment of apparatus for carrying out the method of this invention. Referring in particular to FIG. 1a, there is shown a quartz ampule 10 containing crystal feed material 11 in particulate form. It is to be understood that the ampule is provided with a closure means through which material can be introduced and withdrawn. Also means can be provided for introducing an ambient such as an inert gas into the ampule or placing the ampule under a vacuum. Positioned in the lower end of the ampule is a seed crystal 12 while resting thereon or in close proximity thereto is a susceptor 13. The susceptor is perforate having openings 14 which extend therethrough from its upper to its lower surface. It is usually preferred to use a susceptor formed of graphite although susceptors fabricated from other materials such as platinum, iridium, silver, gold and the like can be utilized. A RF induction coil 16 having an inverted conical form and connected to a RF generator (not shown) surrounds the lower end of ampule 10.

As illustrated in FIG. 1a, ampule 10, susceptor 13 and coil 16 are in position for commencement of the crystal growing procedure. Thus, susceptor 13 is just within coil 16 and in close proximity to seed crystal 12. Initially, the RF generator is turned on, and the power is increased until the top of seed crystal 12 is melted. Thereafter, the ampule is lowered by means of line 17 attached to ring 18 which is connected to the upper end of the ampule. As the ampule is lowered through the induction coil, crystal feed material 11 adjacent heated susceptor 13 is melted and the melt flows through openings 14 into contact with the melted seed crystal. In other words, upon lowering of the ampule through the RF coil the perforated susceptor passes through the melted crystal feed material, thereby placing the melt in contact with the melted portion of the seed crystal.

As lowering of the ampule continues, the melt in contact with the melted portion of the seed crystal cools and crystal growth commences. Simultaneously with the lowering of the ampule, additional crystal feed material is melted and the susceptor passes through the melt, thereby providing additional melt for continued crystal growth. In effect susceptor 13 floats on the melt produced by melting of the crystal feed material so that it can be termed a floating susceptor.

A better understanding of the manner in which crystal growth progresses can be obtained by referring to FIG. 1b. As shown in this figure, ampule 10 has been lowered a substantial distance through RF coil 16. Grown crystal 19 has formed in the end of the ampule as a result of crystal growth. Immediately above the grown crystal is melt 21 on which susceptor 13 floats and above susceptor 13 is a thin layer of melt. As ampule 13 moves downwardly, additional melt is formed through which the susceptor passes and crystal growth proceeds as the melt solidifies. This procedure continues until all, or substantially all, of the crystal feed material has been melted and crystallized to a single crystal.

Power supplied by the RF generator to induction coil 16 is controlled so that susceptor 13 is heated to a temperature sufficient to melt the crystal feed material. Furthermore, the susceptor is maintained at a temperature such that the height of the melt between the lower surface of the susceptor and the interface between the melt and the grown crystal is in the range of about 2 to 10 millimeters. The temperature to which the susceptor is heated will depend upon the melting point of the particular feed material utilized. Control of the RF current supplied to the induction coil in order to heat the susceptor and obtain the desired melting is well within the skill of the art. In any event the system can sustain inadvertent power fluctuations. For example, if the power increases, the floating susceptor tends to rise and in so doing decouples itself from the induction coil, thereby promoting the maintenance of a constant temperature.

The crystal growth rate must be slow in order to grow homogeneous, highly perfect, single crystals. Accordingly, it is necessary that the ampule be lowered slowly through the induction coil. Also, when using crystal growth materials exhibiting large supercooling, the temperature gradient at the solid-liquid growth interface should be uniform and as large as possible. By proceeding in accordance with the present invention wherein the floating susceptor is immersed in the crystal feed material, there is provided a thermally stable and flat interface at the solid-liquid growth interface. The provision of a thermally stable and flat interface tends to promote a uniform thermal gradient having a highest possible value. Thus, it is possible by the present method to prepare single crystals from compounds which are subject to large supercooling. While the rate at which the ampule is lowered through the induction coil will depend to a certain degree upon the particular crystal growth material utilized, the ampule is generally lowered at a rate ranging from about 10 to 50 millimeters per day.

Referring now to FIGS. 2a and 2b of the drawing, another embodiment of apparatus for practicing the method of this invention is schematically illustrated. In FIG. 2a the crystal feed material is in the form of a sintered rod 22 of the compacted material. The rod is held in position by a frame 23 comprising a vertical leg 24 and upper and lower horizontal legs 26 and 27. The ends of the rods are disposed in upper and lower recesses 28 and 29 formed in the outer ends of the horizontal legs of the frame member. The recesses can appropriately be formed of a pair of flanges, each bolted or otherwise attached to a horizontal leg so as to permit positioning of the rod.

A seed crystal 31 is disposed in the bottom of lower recess 29. Resting on or in close proximity to the seed crystal is susceptor 32 which is in the form of a metal screen. Sintered bar 22 in turn rests on susceptor 32.

While it is often preferred to use an iridium screen as the susceptor, it is within the scope of the invention to utilize screens formed of other metals such as tungeten, tantalum molybdenum, and the like. It is to be understood that the material selected must be capable of withstanding the conditions encountered during conduct of the method. A RF induction coil 33 having an inverted conical form and connected to a RF generator (not shown) surrounds the lower end of rod 22. Associated with the induction coil and surrounding rod 22 is a water-cooled bucking plate 34 whose function is to stabilize the lateral position of the susceptor. The use of the bucking plate, which is conveniently brazed to the top of the induction coil, to shape the magnetic field, is well known in the art. There is a handle 36 attached to horizontal arm 26 with a line 37 connected thereto to provide means for lowering and raising frame member 23.

The apparatus depicted in FIG. 2a is in position for commencement of the crystal growing procedure. While the apparatus of FIGS. 1a and 2a are quite dissimilar, the crystal growing procedures performed by the apparatus are quite similar. Susceptor 32, which is in close proximity to seed crystal 31, is just within induction coil 33. After the RF generator is turned on, its power is increased until the top of the seed crystal is melted. Frame member 24 is then lowered by means of line 37 attached to handle 36. As the frame is lowered carrying with it rod 22, the rod adjacent susceptor 32 is melted and the melt flows through openings in the screen into contact with the melted seed material. As is the case with the susceptor of the apparatus of FIG. 1a, susceptor 32 passes through the melt formed by melting of the lower end of rod 22, thereby placing the melt in contact with the melted portion of the seed crystal.

As lowering of frame 24 together with rod 22 continues, the melt in contact with the melted portion of the seed crystal cools and crystal growth commences. Upon lowering of the rod, the end thereof is melted, providing melt through which the susceptor passes. Additional melt is thereby furnished for continued crystal growth. Like susceptor 13 shown in FIG. 1b, susceptor 32 floats on the melt formed by melting of bar 22.

Reference is now made to FIG. 2b in order to obtain a more complete understanding of the manner in which crystal growth progresses. As depicted in this figure, rod 22 supported in frame 24 has been lowered a substantial distance through RF coil 33. Grown crystal 38 disposed in recess 29 and extending upwardly therefrom has formed as a result of crystal growth. Adjacent the upper end of the grown crystal is melt 39 on which susceptor 32 floats. Above susceptor 32 there is a thin layer of melt. Upon downward movement of frame 23 and rod 22, additional melt is formed. The susceptor passes through the melt and crystal growth proceeds as the melt solidifies. This procedure is followed until all or substantially all of the rod has been melted and the melt has crystallized to a single crystal.

The discussion hereinbefore concerning the conditions for carrying out the method with the apparatus of FIG. 1a applies generally to the operation of the apparatus of FIG. 2a. Thus, the temperature is controlled as described and the frame and rod are lowered at about the same rate as the ampule. However, several additional advantages do accrue from utilizing the apparatus of FIG. 2a. Thus, it is unnecessary to employ a crucible, i.e., a container for holding the crystal feed material. By positioning the apparatus in an enclosure, any ambient, such as an inert gas, e.g., argon, helium or nitrogen, oxygen, hydrogen or a vacuum, can readily be employed. The melt surface tension does not have to be large so that materials of low surface tension can be grown. Very long crystals can be grown, and because melt height need only be from 2 to 3 millimeters large area crystals can be grown.

A more complete understanding of the invention can be obtained by referring to the following illustrative examples which are not intended, however, to be unduly limitative of the invention.

EXAMPLE I

A run is conducted in which a single crystal of proustite ($Ag_3AsS_3$) is grown, utilizing apparatus similar to that shown in FIG. 1a. In carrying out the run, proustite feed material in particulate form is loaded into the quartz ampule which also contains a seed crystal and the graphite susceptor. The ampule is vacuum pumped, back filled with argon and sealed. The RF generator is turned on and sufficient power is supplied to the induction coil to melt a portion of the seed crystal. The ampule is then lowered through the induction coil, causing the susceptor to pass through the melt formed by melting of the proustite. The ampule is lowered through the coil at the rate of about 12 mm per day. The temperature gradient at the solid-liquid interface is about $150°C\ cm^{-1}$. The lowering of the ampule is continued until the crystal feed material is consumed. A single crystal of proustite of high optical quality is recovered from the ampule.

EXAMPLE II

A run is carried out in accordance with the general procedure followed in Example I except that particulate potassium bromide is used as the crystal feed material. Since KBr is a transparent material, it is observed that the height of the liquid melt can be varied from 2 to 10 mm. For a melt height of 10 mm, the thermal gradient is $380°C\ cm^{-1}$. The solid-liquid interface remains flat independent of the height of the melt. A single crystal of KBr is recovered at the end of the period of crystal growth.

EXAMPLE III

A run is carried out in which a single sapphire ($Al_2O_3$) crystal is grown, employing apparatus similar to that shown in FIG. 2a. A seed crystal is placed in the recess of the frame's lower horizontal leg while an iridium screen susceptor is positioned on the seed crystal. The lower end of a sintered sapphire rod rests on the susceptor while its upper end is placed in the recess of the frame's upper horizontal leg. The RF generator is turned on and sufficient power is supplied to the induction coil to melt a portion of the seed crystal. The frame is then lowered carrying the sapphire rod through the induction coil, causing the susceptor to pass through the melt formed by melting of the lower end of the rod. The water-cooled bucking plate shapes the magnetic field so as to hold the susceptor concentric with the melt. The rod is lowered through the coil at a rate of about 15 mm per day. The lowering of the frame is continued until the sapphire rod is consumed. A single sapphire crystal of high quality is recovered.

By proceeding in accordance with the method of this invention, good quality, single crystals can be prepared from compounds exhibiting large supercooling. Examples of ternary compounds having this property have been mentioned above. Because the solid-liquid interface can be so small and well controlled, crystals can be grown from materials of low surface tension, such as tin, lead and bismuth compounds. Examples of other precursor materials that can be used include the alkali metal halides, silicates such as yttrium aluminum garnet, and oxides such as aluminum oxide.

In view of the foregoing disclosure, modifications of the invention can be made by those skilled in the art without departing from the spirit and scope of the invention.

We claim:

1. A method of growing a single crystal from a material which exhibits large supercooling, said method comprising the steps of positioning a foraminous susceptor above and adjacent to a seed crystal and below and in contact with a column of crystal feed material selected from the group consisting of compounds represented by the formulas $M_3AB_3$ and $M_4A_2B_5$, wherein A is P, As or Sb; B is S, Se or Te; and M is Na, K, Li, Ba, Ca, Mg, Be, Zr, Mn, Zn, Ce, Fe, Co, Ni, Cd, Pb, Sn, Cu, Ag, Au or Pt; inductively heating the susceptor so as to melt the top of the seed crystal and a layer of the column of the crystal feed material adjacent the susceptor; passing crystal feed material melt through openings in the susceptor into contact with the melted seed crystal, thereby commencing crystal growth; lowering the column toward the heated susceptor so as to melt the end of the column; passing the resulting melt through openings in the susceptor to provide material for continued crystal growth; and maintaining the temperature of the susceptor at a temperature such that the height of the melt on which the susceptor floats as measured between the lower surface of the susceptor and the interface between the melt and the grown crystal is in the range of about 2 to 10 millimeters.

2. The method according to claim 1 in which the crystal feed material is in particulate form enclosed in an elongated ampule.

3. The method according to claim 1 in which the crystal feed material is in the form of a sintered rod.

4. The method according to claim 2 in which the susceptor is formed of graphite having vertical openings therein.

5. The method according to claim 3 in which the susceptor is an iridium screen.

6. The method according to claim 1 in which the column is lowered at a rate of about 10 to 50 millimeters per day.

7. The method according to claim 1 in which the crystal feed material is proustite.

* * * * *